United States Patent
Saito et al.

(10) Patent No.: US 8,643,033 B2
(45) Date of Patent: Feb. 4, 2014

(54) LIGHT EMITTING DEVICE ARRAY

(71) Applicant: Stanley Electric Co., Ltd., Tokyo (JP)

(72) Inventors: Tatsuma Saito, Yokohama (JP); Mamoru Miyachi, Okegawa (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/802,334

(22) Filed: Mar. 13, 2013

(65) Prior Publication Data

US 2013/0248895 A1 Sep. 26, 2013

(51) Int. Cl.
*H01L 29/18* (2006.01)

(52) U.S. Cl.
USPC ............ 257/88; 257/98; 257/99; 257/79; 257/81; 257/E33.001; 257/E33.071; 257/E33.061

(58) Field of Classification Search
USPC ............ 257/99, 88, 98, 79, 81, E33.001, 257/E33.071, E33.061
See application file for complete search history.

(56) References Cited

U.S. PATENT DOCUMENTS

| | | | |
|---|---|---|---|
| 6,252,351 B1 * | 6/2001 | Koizumi et al. | 313/498 |
| 6,858,875 B2 * | 2/2005 | Hamano et al. | 257/88 |
| 6,885,035 B2 * | 4/2005 | Bhat et al. | 257/99 |
| 7,851,817 B2 | 12/2010 | Yasuda et al. | |
| 8,030,672 B2 | 10/2011 | Harada | |
| 8,035,116 B2 * | 10/2011 | Ogihara et al. | 257/88 |
| 2004/0021145 A1 * | 2/2004 | Hamano et al. | 257/88 |
| 2004/0021146 A1 * | 2/2004 | Fujiwara et al. | 257/93 |
| 2008/0063431 A1 * | 3/2008 | Ogihara et al. | 399/220 |

FOREIGN PATENT DOCUMENTS

| | | |
|---|---|---|
| JP | 2008-034530 A | 2/2008 |
| JP | 2009-206246 A | 9/2009 |
| JP | 2010-015887 A | 1/2010 |

* cited by examiner

*Primary Examiner* — Bilkis Jahan
(74) *Attorney, Agent, or Firm* — Holtz, Holtz, Goodman & Chick, PC

(57) ABSTRACT

A light emitting device includes a substrate elongated in a lengthwise direction; a plurality of LED chips disposed on the substrate in an intermediate region in widthwise direction, and aligned along the lengthwise direction at a distance of 80 μm or less; and interconnection wirings formed on regions outside the intermediate region in the widthwise direction; wherein each of the LED chips has a p-side electrode disposed on the substrate, a p-type semiconductor layer disposed on the p-side electrode, an active layer formed on the p-type semiconductor layer, and an n-type semiconductor layer formed on the active layer, and has a region in which the n-type semiconductor layer, the active layer, and the p-type semiconductor layer are patterned, and an n-side electrode formed selectively on a surface of the n-type semiconductor layer and connected to the p-side electrode of an adjacent LED chip through the interconnection wiring.

4 Claims, 7 Drawing Sheets

LIGHT EMITTING DEVICE ARRAY

CROSS REFERENCE TO RELATED APPLICATION

This application claims the benefit of priority based on Japanese patent application 2012-065226, filed on Mar. 22, 2012, the entire contents of which are incorporated herein by reference.

BACKGROUND OF THE INVENTION

A) Field of the Invention

The present invention relates to a light emitting device such as an LED array and automotive lightings including an LED array.

B) Description of the Related Art

There are demands for large output LED elements designed for use in automotive headlamps and lightings. Simply increasing the areal size will necessitate a large driving current, which is difficult to flown uniformly in a semiconductor chip. A known solution is to divide the LED device into a plurality of LED elements and connect the plurality of LED elements in series (see, for example, patent documents 1, 2, and 3).

Applications such as automotive headlamps require a horizontally extended flux of light. This is achieved by a plurality of LED elements arranged or aligned horizontally. If LED elements are prepared separately and arranged along a horizontal line on a support substrate, an interval of 100 µm or more is practically required between adjacent pair of LED elements.

FIG. 6A is a schematic plan view of a conventional LED array 200, and FIG. 6B is a partial cross section of the LED array 200 depicted in FIG. 6A along virtual line cd. Four nitride semiconductor light emitting diode elements (LED elements) 201 are disposed and connected in series on a support substrate, such as a Si substrate 230 provided with an insulation film 207. As illustrated in FIG. 6B, each LED element 201 contains a light emitting structure 202 made of lamination of an n-type GaN layer 221, an active layer 222, and a p-type GaN layer 223 stacked in this order from the top; a p-side electrode 212 formed in contact with the p-type GaN layer 223 on a rear surface of the light emitting structure 202; an n-side electrode 208 of parallel stripe shape in contact with the n-type GaN layer 221 on top of the light emitting structure 202; an insulation film 210 covering from the top surface to the side surface of the light emitting structure 202; and interconnection wiring 211 elongated from the n-side electrodes 208 and extending from on the insulation film 210 to on the p-side electrode 212 and connected to the p-side electrode 212 of the adjacent LED element (for the rightmost LED element, no LED element exists on the right-hand side and the wire 211 serves as a lead wire).

Patent document 1: Japanese Unexamined Patent Publication (Kokai) No. 2008-034530.

Patent document 2: Japanese Unexamined Patent Publication (Kokai) No. 2009-206246.

Patent document 3: Japanese Unexamined Patent Publication (Kokai) No. 2010-015887.

As illustrated in FIGS. 6A and 6B, intervals of about 100 µm or more are practically required between adjacent LED elements if separate LED elements are assembled on a support substrate. If a lighting apparatus is produced by utilizing a phosphor or fluorescence powder-containing sealing resin layer covering a plurality of LED elements, the resulting emitted light will be nonuniform in brightness distribution and chromaticity distribution. It will be difficult to achieve uniform brightness and uniform chromaticity distributions.

SUMMARY OF THE INVENTION

An object of this invention is to provide an LED array with suppressed brightness distribution and light color distribution.

According to an aspect of the present invention, a light emitting device comprises:

a substrate elongated in a lengthwise direction and having a widthwise direction perpendicular to the lengthwise direction;

a plurality of LED chips disposed on the substrate in an intermediate region in the widthwise direction, and aligned along the lengthwise direction; and interconnection wirings formed on regions outside of the intermediate region in the widthwise direction, wherein distances between adjacent pair of the LED chips aligned along the lengthwise direction is 80 µm or less, and each of the LED chips has a p-side electrode disposed on the substrate, a p-type semiconductor layer disposed on the p-side electrode and connected electrically to the p-side electrode, an active layer formed on the p-type semiconductor layer, and an n-type semiconductor layer formed on the active layer, and has a region in which the n-type semiconductor layer, the active layer, and the p-type semiconductor layer are patterned, and an n-side electrode formed selectively on a surface of the n-type semiconductor layer and connected to the p-side electrode of an adjacent LED chip through the interconnection wiring.

Reduction in the distances between LED chips makes uniformalization of light brightness distribution easier. Uniformalization of light color distribution will also be made easier.

BRIEF DESCRIPTION OF THE DRAWINGS

FIGS. 3A to 33 are schematic cross sections for illustrating main processes of manufacturing the LED array 100 according to the first embodiment.

FIG. 4 is a schematic plan view of an LED array 100 according to a second embodiment of the present invention.

DESCRIPTION OF THE PREFERRED EMBODIMENTS

Figure 6A:
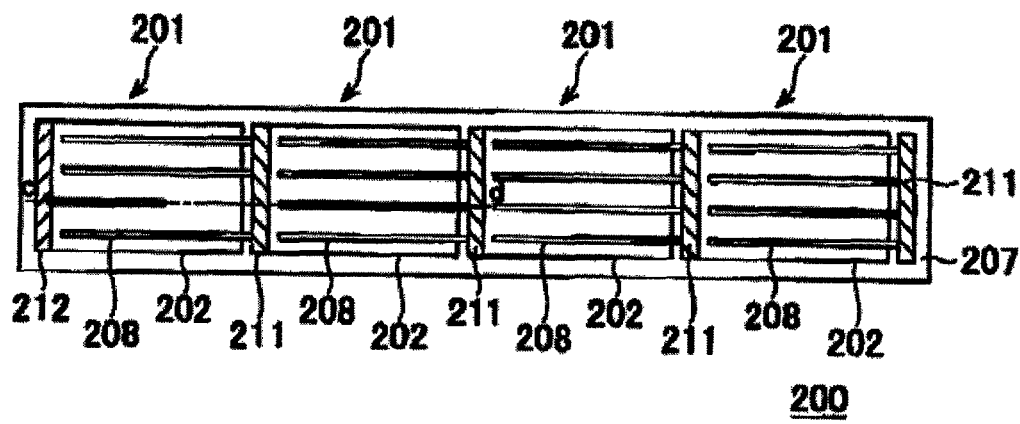
FIGS. 6A, 6B, and 6C are a plan view and a cross section of a conventional LED array 200 and a schematic plan view of its light emitting state.
Figure 6B:
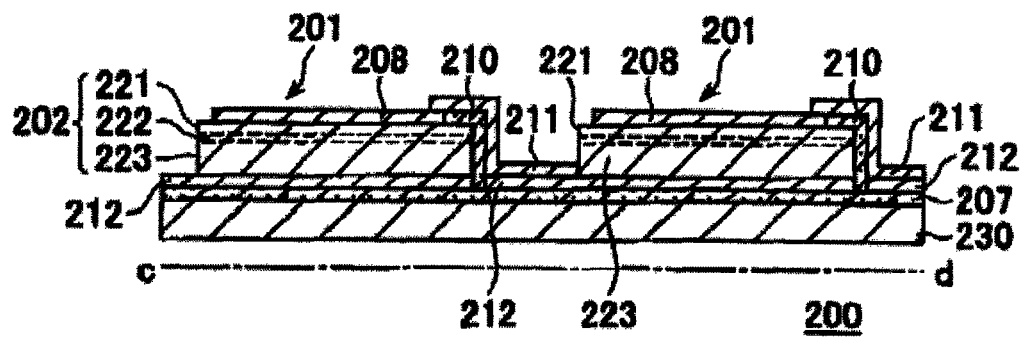
Figure 6C:
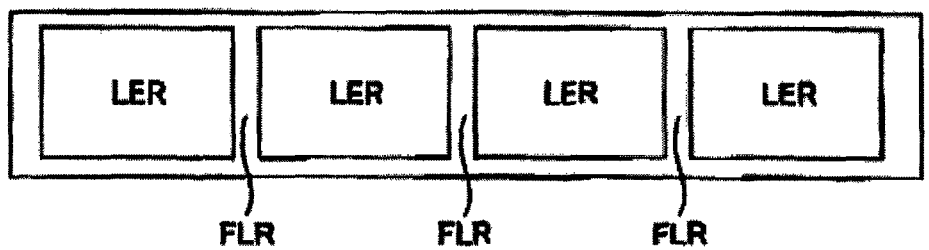

FIG. 6C is a schematic view of an LED array as illustrated in FIGS. 6A and 6B supplied with electric current to emit light. Each light emitting region LER is formed of semiconductor light emitting structure. For example, an InGaN based light emitting layer emits blue light. To produce white light, a sealing resin layer containing phosphor or fluorescent powders that emit yellow lights, for example, is formed over the surface of an LED array so that the blue light emitted from the LED elements and the wavelength converted yellow light from the fluorescence powder are combined to produce white lights. In contrast to this, no semiconductor light emitting layer exists in the fluorescence regions FLR between the light emitting regions LER, and accordingly, the fluorescence regions FLR act as non-light emitting regions that do not spontaneously emit light. Thus, the brightness of the fluorescence region FLR is low. When blue lights come in from adjacent LED elements, the fluorescence powders will emit yellow light. Since there is no spontaneous emission of blue light, the fluorescence region will appear as yellowish region.

Figure 1A:
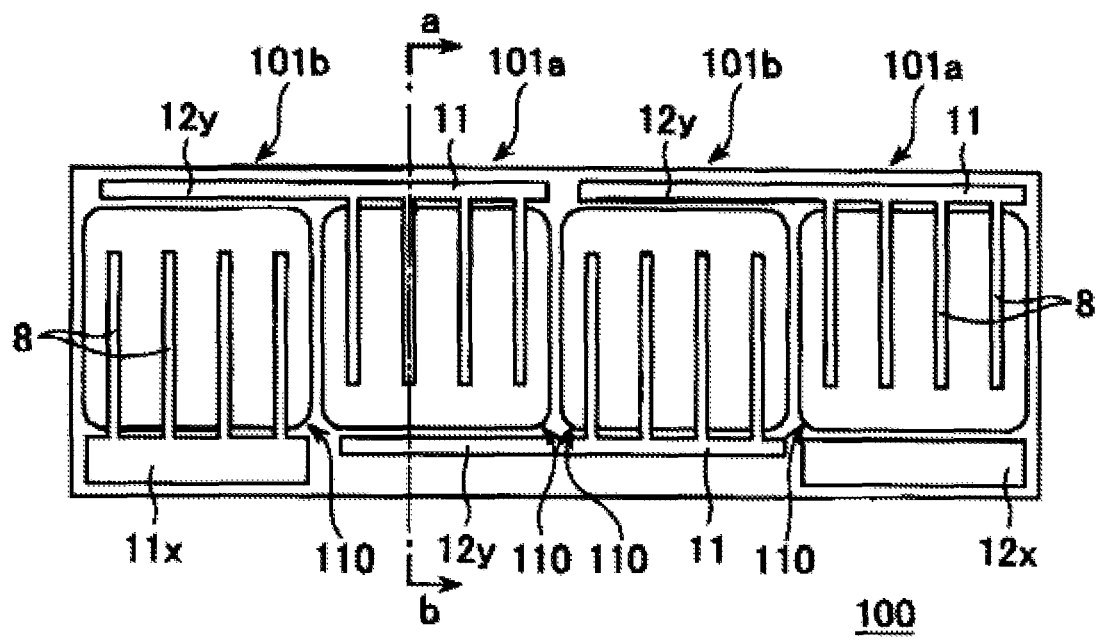
FIGS. 1A and 1B are a schematic plan view of an LED array 100 according to a first embodiment of the present invention and a schematic cross section of an LED element 101 along a line a-b, respectively.
Figure 1B:
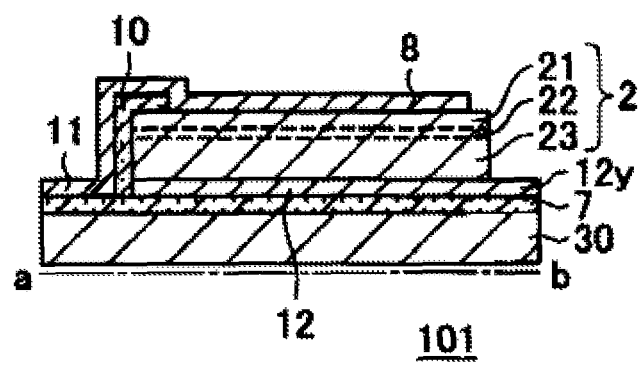

As a result, an LED array as illustrated in FIGS. 6A-6C has large possibility of appearing as a light emitting apparatus that has nonuniform brightness distribution and nonuniform color distribution. The inventors made researches for reducing the intervals (distances) between LED elements, for suppressing nonuniform brightness distribution. In a structure where interconnection wirings are provided between adjacent LED elements, the minimum distance between adjacent LED elements was 100 μm, and further reduction was impractical. Reduction of distance between adjacent LED chips became possible in the case of forming lamination of epitaxial layers for LED structure on a growth substrate such as sapphire, etching the lamination for dividing the lamination into separate LED elements, bonding a support substrate on the lamination structure, peeling off the growth substrate, forming electrode and interconnection wiring and performing scribing or dicing to obtain LED arrays. Interconnection wirings are formed on the widthwise peripheral regions of a substrate, and there is no interconnection wiring between adjacent LED chips. The interval (distance) between adjacent LED elements can be reduced to 80 μm or less, for example, about 30 μm, which represents the process limit, FIG. 1A is a schematic plan view of an LED array 100 according to the first embodiment of the present invention and FIG. 1B is a schematic cross section along the line a-b of an LED element 101 included in the LED array 100. In the LED array 100, a support substrate (Si substrate) 30 is elongated in one direction. An insulation layer ($SiO_2$ layer) 7 is formed on the support substrate 30. Four nitride semiconductor light emitting chips (LED elements) 101 are aligned on the support substrate 30 along the lengthwise direction and connected in series.

As illustrated in FIG. 1B, an LED element 101 has a light emitting structure 2 that includes an n-type GaN layer 21, an active layer 22, and a p-type GaN layer 23 stacked in this order from the top; a p-side electrode 12 formed in contact with the p-type GaN layer 23 on a rear surface of the light emitting structure 2; n-side electrode 8 of parallel stripe shape formed on upper surface of the light emitting structure 2 in contact with the n-type GaN layer 21; an insulation film 10 covering from an upper surface to a side surface of the light emitting structure 2; and an interconnection wiring 11 extending from the n-side electrode 8 to extend from an upper surface of the insulation film 10 to an upper surface of an insulation film 7.

As illustrated in FIG. 1A, two elements 101a in which n-side electrodes 8 extend from the top toward the bottom in the figure and two elements 101b in which the n-side electrodes 8 extend from the bottom toward the top are disposed alternately. The elements 101a and the elements 101b have basically the same structure except for being mirrored vertically or upside-down configuration.

In the leftmost LED element 101b, the interconnection wiring 11 is widened to form an n-side bonding pad 11x, while at the top portion, the p-side electrode 12 is extended upward to form an interconnection wiring 12y. The interconnection wiring 12y is extended to the right and connected to the interconnection wiring 11 which is connected to the n-side electrode 8 of the second LED element 101a from the left (right-hand neighboring one). The p-side electrode 12 of this LED element 101a is extended downward to form an interconnection wiring 12y. The interconnection wiring 12y is extended to the right and connected to the interconnection wiring 11 which is connected to the n-side electrode 8 of the third LED element 101b from the left (right-hand neighboring one). In the top portion of the two right-hand LED elements, interconnection wirings 12y and 11 are formed in the same manner as in the top portion of the two left-hand LED elements. The p-side electrode 12 of the right-hand LED element 101a is extended downward to form a large-width bonding pad 12x.

The distances between adjacent LED chips 110 are set to 80 μm or less, for example 30 μm, to decrease the width of the fluorescence (non-light emitting) region FLR defined in FIG. 6C. Reduction in the areal size of the non-light emitting region FLR is effective for suppressing the nonuniform brightness distribution. As regards the epitaxial layer grown on the growth substrate, the utilization efficiency of the epitaxial layer in the lengthwise direction of the support substrate 30 can be improved by the reduction of the intervening areas FLR. With respect to the width direction of the support substrate 30, the bonding pads 11x and 12x are located on the same peripheral region along the same edge, serving to decrease the widthwise size of the unused part of the epitaxial layer, compared with the case where the bonding pads are located on opposing peripheral regions along both edges. Increase in the utilization efficiency of the epitaxial layer is effective for cost reduction. It also serves to reduce nonuniform color distribution due to filling the intervening areas with fluorescence powder-containing sealing resin.

In this case, in one type of LED element 101a, an interconnection wiring 11 is disposed in the upper peripheral portion and parallel n-side electrodes 8 extend downward from it. As the electrode resistance increases from the top toward the bottom in the figure, the injected current tends to decrease gradually. This results in a light emitting brightness distribution in which brightness is relatively higher in the upper portion and lower in the lower portion. In another type of LED element 101b, an interconnection wiring 11 is disposed in the lower peripheral portion and parallel n-side electrodes 8 extend upward from it. As the electrode resistance increases from the bottom toward the top in the figure, the injected current tends to decrease gradually. This results in a light emitting brightness distribution in which brightness is relatively higher in the lower portion and lower in the upper portion.

It should be noted that in the LED array, the plurality of LED elements are not necessarily aligned in a line, and the number of LED elements is not limited to four. With respect to the arrangement of LED elements, they may be arranged in a matrix of plural rows and plural columns as well as in one row. The shape of individual LED elements may be appropriately selected from the various shapes such as square, rectangle, and so on.

There are demands for large output LED elements designed for use in automotive headlamps and lightings. Simply increasing the areal size of the elements will lead to an increase in driving current. This makes it difficult to supply electric current uniformly. In this embodiment, a plurality of LED elements 101 are assembled in an array to form an LED array 100. To allow an electric current to flow uniformly through a plurality of LED elements 101, it is preferable to connect the LED elements in series.

In the case of automotive headlamps, the LED array 100 is required to light the ground/road surface and its vicinity and hence preferably have a horizontally wide shape extended in the horizontal direction. As regards its size, the LED array 100 has, for example, a width of 5 mm or more and a height of 1 mm or less.

Figure 2A:
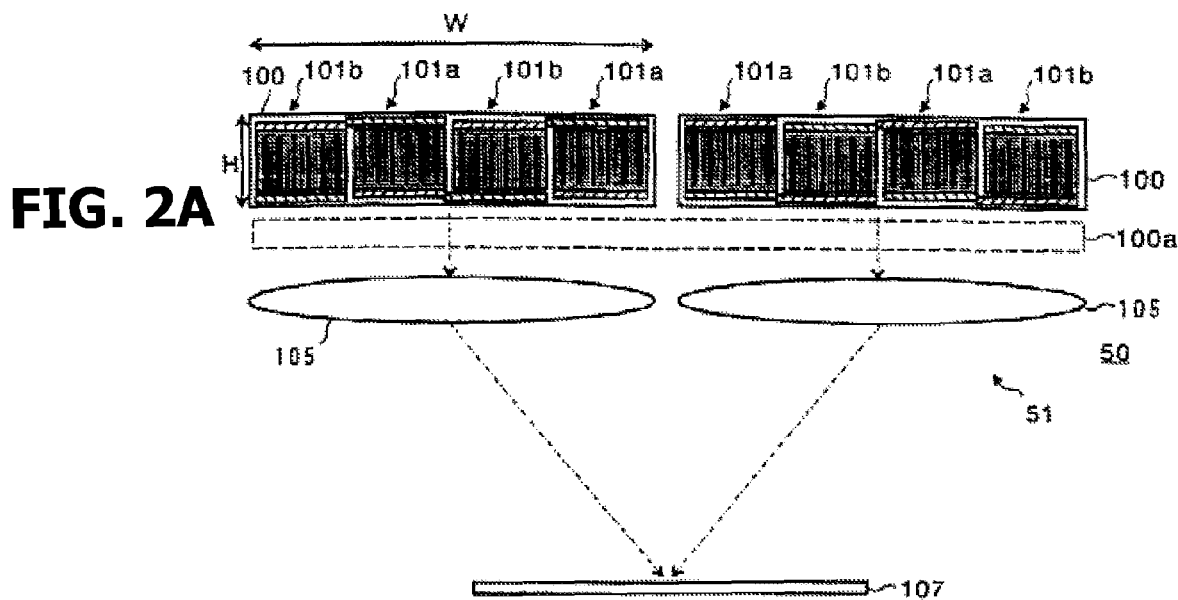
FIGS. 2A, 2B, and 2C are schematic diagrams illustrating three structures of automotive lighting (headlamp) 50 incorporating the LED array 100.
Figure 2B:
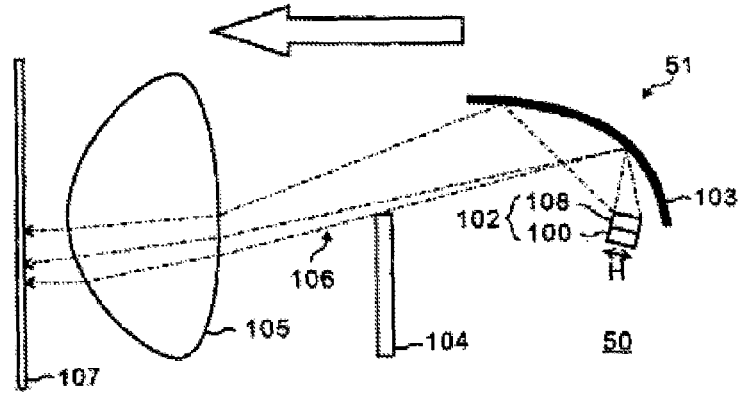
Figure 2C:
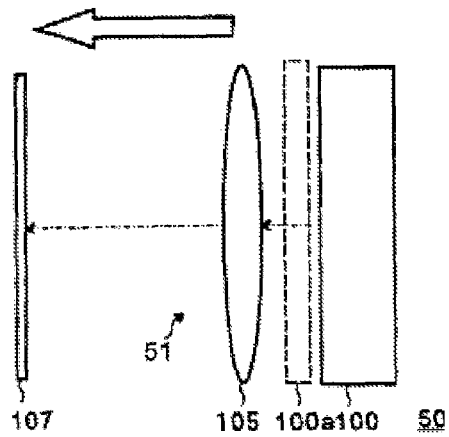

FIGS. 2A-2C are diagrams showing structures of automotive lightings (headlamps) 50 equipped with the LED arrays 100 according to the embodiment of the invention. FIG. 2A shows an example of a projection optical system 51. Two projection lenses 105 are used for two LED arrays 100 in the projection optical system 51. The projection lenses 105 are positioned to make optical source images 106 of the LED arrays 100 having mirrored electrode patterns overlap with each other on a virtual vertical screen (projection surface) 107 which faces a front of a vehicle. When one LED array 100 has the LED elements 101b, 101a, 101b and 101a horizontally lined up in this order as shown in FIG. 1A and another LED array 100 is a mirror image of that shown in FIG. 1A, i.e., the another LED array 100 has the LED elements 101a, 101b, 101a and 101b horizontally lined up in this order, a projection image of the LED element 101a having a brightness distribution which gradually becomes darker from the top to the bottom and a projection image of the LED element 101b having a brightness distribution which gradually becomes brighter from the top to the bottom are overlapped with each other on the projection surface 107. Therefore, the uneven brightness can be reduced.

As shown in FIG. 2B, a projection optical system 51 can be equipped with a multireflector (reflection surfaces) 103 and a projection lens 105, to share the projection lens 105 with a plurality of LED arrays 100. The headlamp 50 shown in FIG. 2B includes light sources formed of at least two LED arrays each having an LED array 101 and a fluorescent material layer 108 covering the LED array, and a projection optical system 51 including reflection surfaces 103 which are multi-reflectors divided into a plurality of small reflection regions, a shade 104 and a projector lens 105.

As depicted in FIG. 2B, the light source is positioned to make its projecting direction (light emitting surface) upward. The reflection surface 103 is a spheroidal reflection surface whose first focal point is set near the light source and second focal point is set near the upper edge of the shade 104, and it is positioned to cover the side and the front of the light source so that lights from the light source irradiate the reflection surface 103.

As depicted in FIG. 2B, the reflection surface 103 projects the light source images 106 of the plurality of the LED arrays 100 of the light source to the front of a vehicle and is designed to project the light source images 106 of the LED arrays 100 on the virtual vertical screen (projection surface) 107 which faces the front of the vehicle.

The shade 104 is a shading part for shading a portion of reflected light from the reflection surface 103 to form a cutoff line suitable for a headlamp. The shade 104 is disposed between the projection lens 105 and the light source 102, placing its upper edge near the focal point of the projection lens 105. The projection lens 105 is positioned at front side of a vehicle, and reflects the lights reflected from the reflection surface 103 toward the projection surface 107.

As in the above, by using two LED array 100 whose electrode patterns (brightness distributions) are mirrored horizontally (180-degree rotational symmetry) and by designing the headlamp 50 to make their projection images overlap on the projection surface 107, it becomes possible to further reduce the uneven brightness distribution. It is also possible to form an automobile lighting instrument using one LED array.

FIG. 2C depicts a projection optical system 51 in which a projection lens 105 forms a projection image of the LED array 100 on a projection surface 107. The projection lens 105 is set to project the optical image 106 of the LED array 100 on the virtual vertical screen (projection surface) 107 which faces the front of the vehicle.

A method for producing the LED array 100 according to the embodiment will be described below, referring to FIGS. 3A to 3J. FIGS. 3A to 3J are schematic cross sections along the line ab in FIG. 1. Accordingly, only one nitride semiconductor light emitting chip (LED element) 101a is depicted in each of FIGS. 3A-3J. Actually, at least four LED elements 101a and 101b in total are alternately disposed on one substrate. It should be noted that the following manufacturing method is given only as an example, and the invention is not limited thereto.

Figure 3A:
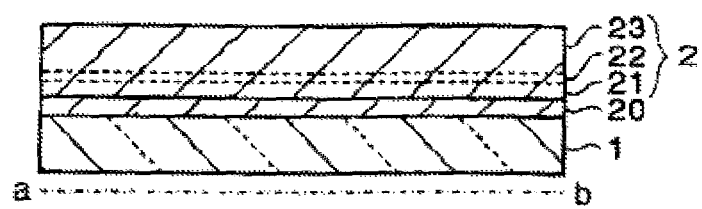

As illustrated in FIG. 3A, a transparent substrate 1 made of sapphire is prepared, and a device structure lamination (light emitting structure) 2 made of nitride semiconductor is formed by the metal organic chemical vapor deposition (MOCVD). Specifically, a sapphire substrate 1, for example, is placed in an MOCVD furnace. The substrate is first subjected to thermal cleaning. Then, a GaN buffer layer 20 is grown on the substrate, followed by sequential growth of an n-type GaN layer 21 doped with, for example, Si and having a thickness of about 5 µm, a multiple quantum well light emitting structure (active layer) 22 containing InGaN quantum well layers, and a p-type GaN layer 23 doped with an acceptor substance such as Mg and having a thickness of about 0.5 µm, thereby producing a light emitting structure 2. It should be noted that different scales are used for convenience in the cross sections given in FIG. 3A to 3J.

The transparent substrate 1 is a single crystal substrate having lattice constant that permits epitaxial growth of GaN, and selected from those which are transparent to light with a wavelength of 362 nm, i.e., the absorption edge wavelength of GaN, so that the substrate can be peeled off by the laser lift-off technology in a later step. Other materials such as spinel, SiC, and ZnO may be used as well as sapphire.

Figure 3B:
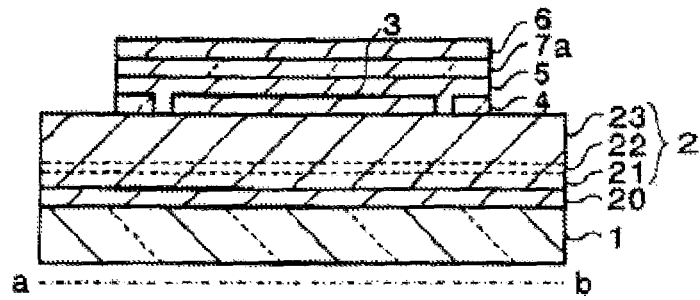

As illustrated in FIG. 3B, an Ag layer with a thickness of 200 nm is formed by electron beam deposition on the surface of a device structure lamination 2 (surface of p-type GaN layer 23), and is patterned by photolithography and etching to make patterned p-electrode layer (first electrode layer) 3. Subsequently, an etching stop layer 4 made of $SiO_2$ and having the same film thickness as the p-electrode layer 3 is formed by sputtering on the device structure lamination 2 (on the p-type GaN layer 23) in regions near the p-electrode layer 3. The etching stop layer 4 will act as etching stopper in the etching step as illustrated in FIG. 3H.

Then, a diffusion preventing layer 5 made of TiW and having a thickness of 300 nm is formed by sputtering in a region containing the p-electrode layer 3 and the etching stop layer 4. The diffusion preventing layer 5 serves to prevent the diffusion of the material used in the p-electrode layer 3. If Ag is included in the p-electrode layer 3, Ti, W, Pt, Pd, Mo, Ru, Ir, or an alloy thereof can be used as material for the diffusion preventing layer 5. Following this, an insulation layer 7a made of $SiO_2$ is formed on the diffusion preventing layer 5 by, for example, chemical vapor deposition (CVD), and a first adhesion layer 6 made of Au and having a thickness of 200 nm is formed by sputtering on the insulation layer 7a.

Figure 3C:
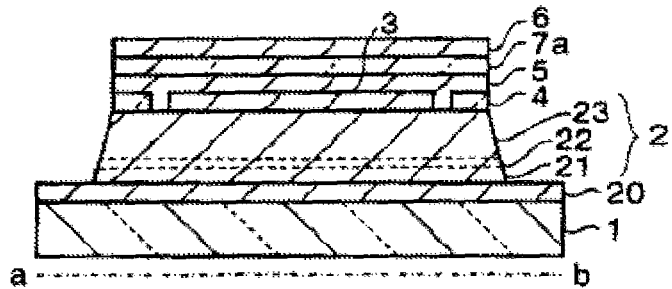

As illustrated in FIG. 3C, the device structure lamination 2 is divided into a plurality of elements of a rectangular shape by dry etching using a resist mask and chlorine gas. Each side face of the divided device structure lamination 2 has a forwardly tapered shape that decreases the device structure lamination in planar cross section towards the top.

Figure 3D:
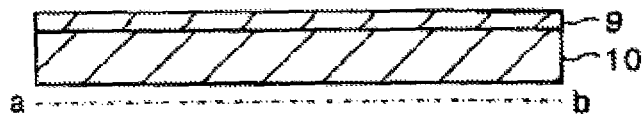

As illustrated in FIG. 3D, a support substrate 10 made of Si is prepared, and a second adhesion layer 9 made of AuSn (Sn: 20 wt %) and having a thickness of 1 μm is formed on it by the resistance heater deposition. It is preferable that the support substrate 10 is made of a material that has a thermal expansion coefficient close to that of sapphire ($7.5\times10^{-6}$/K) and GaN ($5.6\times10^{-6}$/K) and has a high heat conductivity. Usable materials include, for example, Si, AlN, Mo, W, and CuW. The material of the first adhesion layer 6 and the material of the second adhesion layer 9 may be fusion-bondable metals containing, for example, Au—Sn, Au—In, Pd—In, Cu—In, Cu—Sn, Ag—Sn, Ag—In, or Ni—Sn, or diffusion-bondable metals containing Au.

Figure 3E:
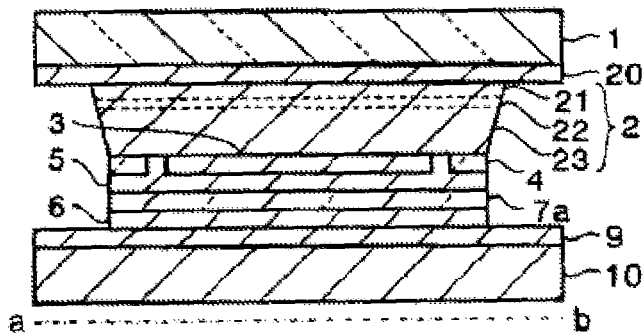

As illustrated in FIG. 3E, the first adhesion layer 6 and the second adhesion layer 9 are brought into contact with each other and heated at 300° C. for 10 min under a pressure of 3 MPa, followed by cooling to room temperature to achieve fusion bonding.

Figure 3F:
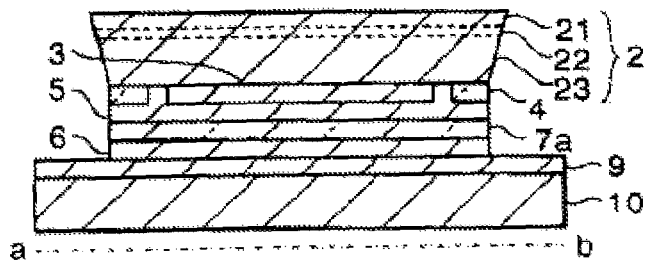

As illustrated in FIG. 3F, UV excimer laser lights are irradiated from the rear surface of the sapphire substrate 1 to heat and decompose the buffer layer 20, peeling off the sapphire substrate 1 by laser lift-off. Here, other technologies such as etching may also be used to peel off or remove the substrate 1.

Figure 3G:
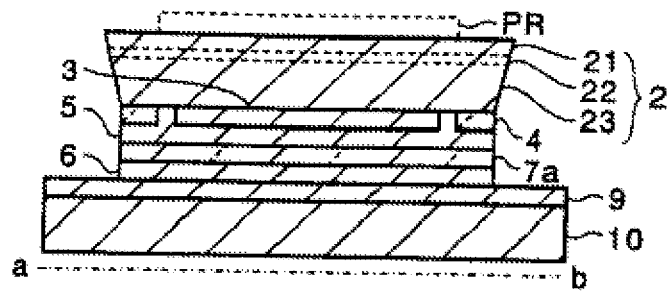
Figure 3H:
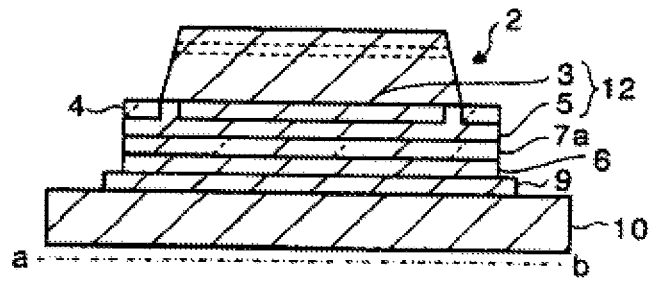

As illustrated in FIG. 3G, a photoresist pattern PR is formed which exposes peripheral portions of the device structure lamination 2. Subsequently, dry etching is carried out using chlorine gas to etch the peripheral portions of the device structure lamination 2 that are not covered by the photoresist pattern PR, until the etching stop layer 4 is exposed.

As illustrated in FIG. 3H, the side wall of the device structure lamination 2 has a forwardly tapered shape in which the planar cross section of the device structure lamination 2 decreases towards the top, assuming the support substrate 10 being located at the bottom. Forwardly tapered shape is free from overhanging or vertical side surface. A forwardly tapered side wall can enhance prevention of cut-off or disconnection of wirings formed thereon.

Figure 3I:
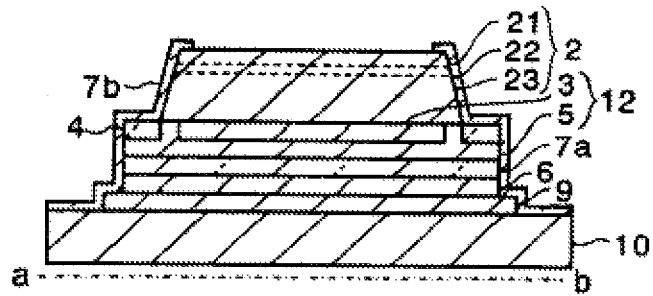

As illustrated in FIG. 3I, a protection film (insulation film) 7b made of $SiO_2$ is formed by, for example, chemical vapor deposition (CVD) to cover the entire upper surface of the element formed in the aforementioned steps, and then part of the protection film 7b formed on the device structure lamination 2 is etched with buffered hydrofluoric acid to expose part of the surface of the device structure lamination 2 (surface of the n-type GaN layer 21 exposed by peeling off the transparent substrate 1).

Figure 3J:
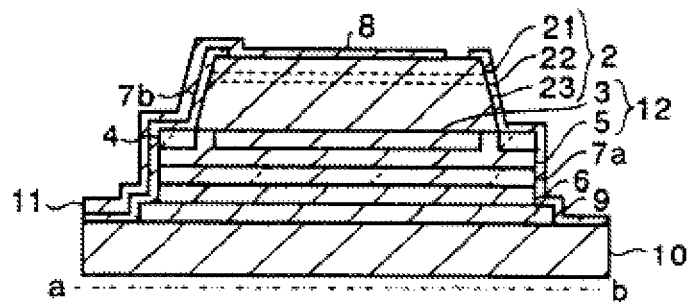

As illustrated in FIG. 3J, a photoresist pattern is formed, and a Ti layer of a thickness of 10 nm, an Al layer with a thickness of 300 nm, and an Au layer with a thickness of 2 μm are formed in this order by electron beam deposition and patterned by lift-off to form, interconnection wirings 11 having, for example, a width of about 40 μm at locations near the upper and lower sides (edges) and being parallel to the upper and lower sides of the device structure lamination 2, and n-side electrodes 8 electrically connected with the interconnection wirings 11 and extending in crossing or orthogonal direction onto the n-type regions 21 and having, for example, a width of 10 μm, simultaneously (also see FIG. 1A). Here, it is preferable that the interconnection wiring 11 has a line width of 20 μm or more and 200 μm or less. It is also preferable that the n-side electrode 8 has a line width of 20 μm or less and 3 μm or more. It is preferable that the interconnection wiring 11 has a line width larger than the line width of each n-side electrode 8.

It is preferable that the interconnection wirings 11 thus formed are located in peripheral regions outside (above and below in FIG. 1A) the device structure lamination 2 so that they will not prevent the extraction of light emitted from the device structure lamination 2. However, the interconnection wiring 11 will have a large wiring resistance if it is located too far away from the device structure lamination 2. Thus, it is preferable that the distance between the device structure lamination 2 and the interconnection wiring 11 is 50 μm or less. The interconnection wirings 11 extend sideward in FIG. 1A to be continuous to the interconnection wirings 12y connected to the p-side electrode 12 of an adjacent element. Thus, interconnection wirings are formed on upper and lower sides of the lined LED chips on the substrate, to form a light emitting element (LED) array 100 including a plurality of LED elements connected in series and aligned on a line. When a plurality of LED arrays 100 are manufactures on a single substrate, the arrays produced are separated from each other by dicing or breaking after scribing.

Figure 4:
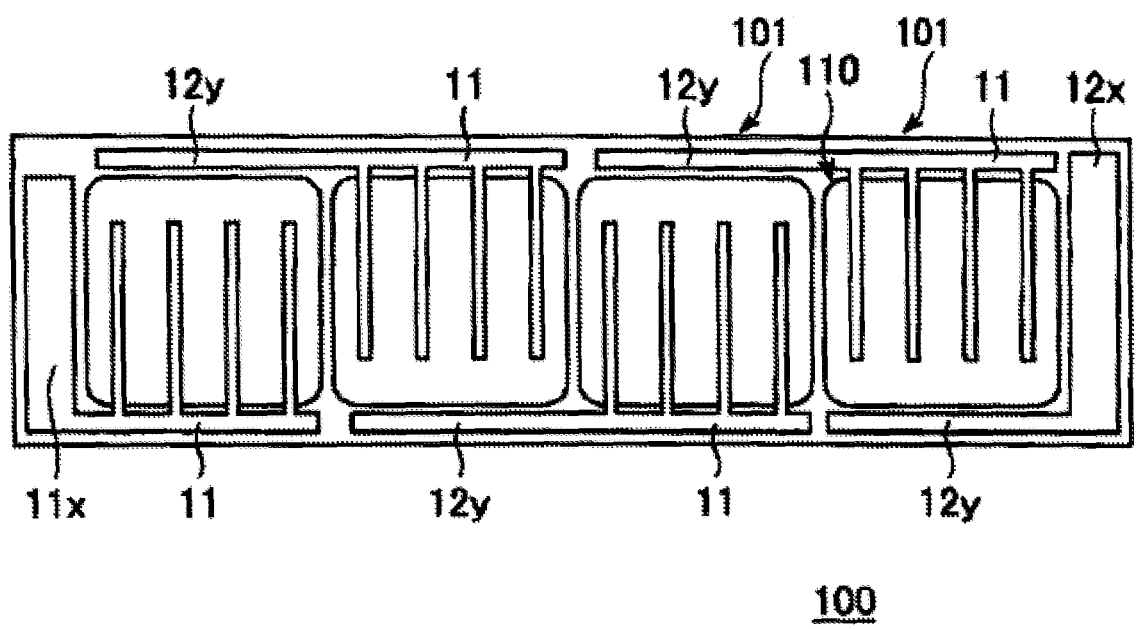

FIG. 4 is a schematic plan view illustrating an LED array 100 according to a second embodiment. In this embodiment, bonding pads 11x and 12x are provided on the lengthwise end regions of the support substrate, and connected to adjacent interconnection wirings 11 and 12y. In the widthwise direction of the base substrate, an interconnection wiring 11 for the n-side electrode 8, an LED chip 110, and an interconnection wiring 12y for the p-side electrode, are sequentially disposed in a lengthwise main region. The interconnection wiring 11 connected to n-side electrode 8 is electrically connected to the interconnection wiring 12y of the LED element 101 located on the left-hand side. Due to the absence of the bonding pads in the lengthwise main region, the width of the substrate can be reduced without reducing the width of the LED chip. This is effective in improving the utilization efficiency of the epitaxial layer in the width direction.

Figure 5A:
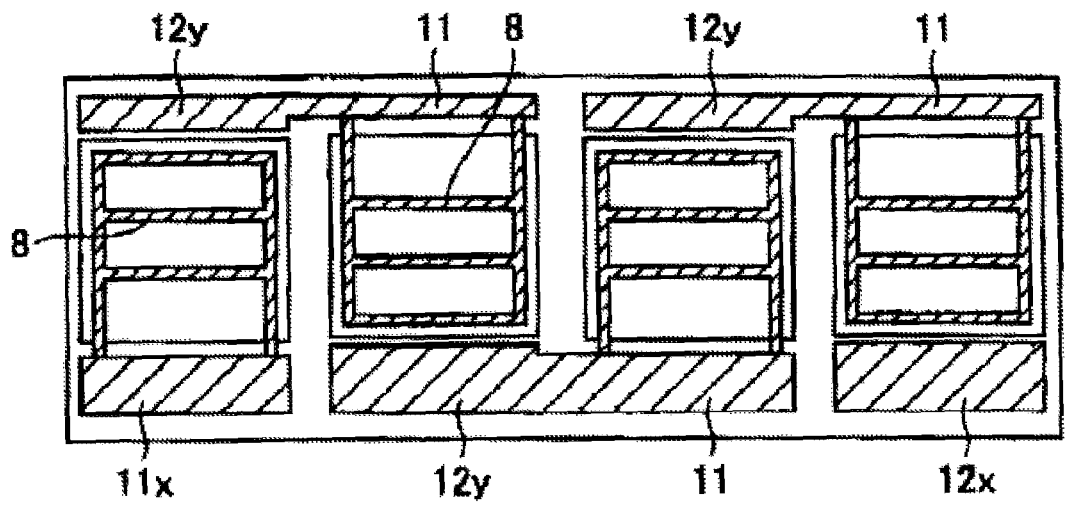
FIG. 5A is a plan view of an LED array 100 according to a modification of the embodiment having a modified electrode.
Figure 5B:
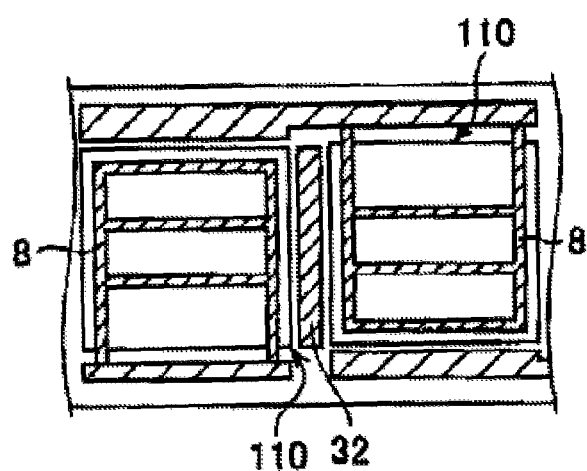
FIGS. 5B and 5C are a partial plan view and a partial cross section, respectively, of an LED array according to another modification of the embodiment having a reflection film.
Figure 5C:
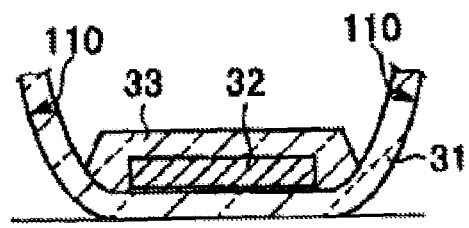

FIGS. 5A to 5C illustrate modifications.

As illustrated in FIG. 5A, an n-side electrode 8 includes rectangular loop-shaped outer peripheral part, parallel stripe part connecting the right and left sides of the outer peripheral part, and extensions of the right and left sides of the outer peripheral part extended to be connected with the interconnection wiring 11 (or 11x). This structure will be called as "ladder type structure". Every point in the n-side electrode 8 is connected with the interconnection 11 or the bonding pad 11x at least in two ways. The bonding pads 11x and 12x are located on the same widthwise side of the support substrate to reduce the total width of the support substrate. The interconnection wiring 11 connected to the n-side electrode 8 is electrically connected to the interconnection wiring 12y of the LED element 101 located on the left-hand side LED element 101, to form series-connection of the LED elements.

FIGS. 5B and 5C are a partial plan view and a partial cross sectional view of a modification in which a reflection layer 32 is formed between LED chips. An insulation film 31 of, for example, silicon oxide is formed on the surface of an LED chip 110, and a reflection pattern 32 of a high reflectance metal such as Ag or Al is formed thereon, followed by covering its surface with an insulation film 33 of, for example, silicon oxide. This is expected to mitigate the brightness deterioration in the region between the chips.

The two-dimensional structure of the electrode 8 located above the device layer may be of comb-like, grid-like, radial, or other various shapes instead of a ladder-like one.

When adjacent LED elements have interconnection wirings 11 on the opposite sides, the light emitting brightness distribution is alternately inverted in the vertical direction, and thus, the light emitting brightness variations over the entire LED array can be reduced. As interconnection wirings 11 are provided outside the top and bottom sides of the LED chips, the distances between the LED chips 110 can be decreased to prevent brightness drop in the regions between the LED chips 110.

Furthermore, a pair of LED arrays 100 having electrode patterns (brightness distributions) mirrored horizontally (180-degree rotational symmetry) may be used to construct a headlamp 50 whose projection images completely overlap each other at the projection surface 107, making it possible to reduce nonuniform brightness distribution in the projection images.

Thus, the present invention has been described based on embodiments and modifications, but the invention should not be construed as being limited thereto. Various other modifications, alterations, and combinations will be apparent to those skilled in the art.

What are claimed are:

1. A light emitting device comprising:
a substrate elongated in a lengthwise direction and having a widthwise direction perpendicular to the lengthwise direction;
a plurality of LED chips disposed on the substrate in an intermediate region in the widthwise direction, and aligned along the lengthwise direction; and
interconnection wirings formed on regions outside of the intermediate region in the widthwise direction,
wherein distances between adjacent pair of the LED chips aligned along the lengthwise direction is 80 μm or less, and
each of the LED chips has a p-side electrode disposed on the substrate, a p-type semiconductor layer disposed on the p-side electrode and connected electrically to the p-side electrode, an active layer formed on the p-type semiconductor layer, and an n-type semiconductor layer formed on the active layer, and has a region in which the n-type semiconductor layer, the active layer, and the p-type semiconductor layer are patterned, and
an n-side electrode formed selectively on a surface of the n-type semiconductor layer and connected to the p-side electrode of an adjacent LED chip through the interconnection wiring.

2. The light emitting device as defined in claim 1, further comprising bonding pads formed on the substrate in one of the outside regions.

3. The light emitting device as defined in claim 1, further comprising bonding pads formed on the substrate in the outside regions.

4. The light emitting device as defined in claim 1, further comprising an optical system capable of forming a projection image of the LED chips.

* * * * *

UNITED STATES PATENT AND TRADEMARK OFFICE
CERTIFICATE OF CORRECTION

| | | Page 1 of 1 |
|---|---|---|
| PATENT NO. | : 8,643,033 B2 | |
| APPLICATION NO. | : 13/802334 | |
| DATED | : February 4, 2014 | |
| INVENTOR(S) | : Tatsuma Saito et al. | |

It is certified that error appears in the above-identified patent and that said Letters Patent is hereby corrected as shown below:

On the Title page:

Below Item (65) Prior Publication Data;

insert --(30) Foreign Application Priority Data

Mar 22, 2012……………………..2012-065226--.

Signed and Sealed this
Fourteenth Day of October, 2014

Michelle K. Lee
*Deputy Director of the United States Patent and Trademark Office*